US012253892B2

(12) United States Patent
Ahrens et al.

(10) Patent No.: US 12,253,892 B2
(45) Date of Patent: Mar. 18, 2025

(54) LID CARVEOUTS FOR PROCESSOR CONNECTION AND ALIGNMENT

(71) Applicant: Advanced Micro Devices, Inc., Santa Clara, CA (US)

(72) Inventors: Jerry Anton Ahrens, Sister Bay, WI (US); William Robert Alverson, Del Valle, TX (US); Amitabh Mehra, Fort Collins, CO (US); Grant Evan Ley, Eden, UT (US); Anil Harwani, Austin, TX (US); Joshua Taylor Knight, Georgetown, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 298 days.

(21) Appl. No.: 17/704,912

(22) Filed: Mar. 25, 2022

(65) Prior Publication Data

US 2023/0315171 A1  Oct. 5, 2023

(51) Int. Cl.
*G06F 1/20* (2006.01)
*H05K 5/02* (2006.01)
(Continued)

(52) U.S. Cl.
CPC ........... *G06F 1/206* (2013.01); *H05K 5/0213* (2013.01); *H05K 5/03* (2013.01); *H05K 7/20209* (2013.01)

(58) Field of Classification Search
CPC ........ G06F 1/206; H05K 5/0213; H05K 5/03; H05K 7/20209; H05K 7/20445;
(Continued)

(56) References Cited

U.S. PATENT DOCUMENTS 4,541,035 A * 9/1985 Carlson ................. H01L 23/147
257/E23.008
5,886,870 A * 3/1999 Omori ................. H01L 23/3677
174/16.3
(Continued)

FOREIGN PATENT DOCUMENTS

CN   2665787 Y   12/2004
CN   208673319 U   3/2019

OTHER PUBLICATIONS

Cutress, Ian, "Intel Launches Xeon-W CPUs for Workstations: Skylake-SP & ECC for LGA2066", AnandTech [Online][retrieved Oct. 11, 2023]. Retrieved from the Internet < https://www.anandtech.com/show/11775/intel-launches-xeon-w-cpus-for-workstations>, Aug. 29, 2017, 8 pages.
(Continued)

*Primary Examiner* — Tho V Duong
(74) *Attorney, Agent, or Firm* — FIG. 1 Patents

(57) ABSTRACT

Package lids with carveouts configured for processor connection and alignment are described. Lid carveouts are configured to align and mechanically secure a cooling device to the package lid by receiving protrusions of the cooling device. Because the lid carveouts ensure precise alignment and orientation of a cooling device relative to a package lid, the lid design enables targeted cooling of discrete portions of the lid. Lid carveouts are further configured to expose one or more connectors disposed on a surface that supports package internal components. When contacted by corresponding connectors of a cooling device, the lid carveouts enable direct connections between the package and the attached cooling device. By creating a direct connection between package components and an attached cooling device, the lid carveouts enable a high-
(Continued)

speed connection for proactive and on-demand cooling actuation.

20 Claims, 9 Drawing Sheets

(51) Int. Cl.
    *H05K 5/03*           (2006.01)
    *H05K 7/20*           (2006.01)

(58) Field of Classification Search
    CPC ............ H05K 7/20436; H05K 7/2039; H05K 7/20409; H05K 7/20418; H05K 7/2049; H05K 7/205; H01L 23/40
    See application file for complete search history.

(56) References Cited

U.S. PATENT DOCUMENTS

| | | | |
|---|---|---|---|
| 6,219,241 B1 | 4/2001 | Jones | |
| 6,252,774 B1 * | 6/2001 | Rife | H01L 23/433 |
| | | | 257/E23.09 |
| 6,728,103 B1 * | 4/2004 | Smedberg | H01L 23/4093 |
| | | | 257/E23.084 |
| 7,120,027 B2 * | 10/2006 | Yatskov | H01L 23/4093 |
| | | | 361/720 |
| 7,432,591 B1 * | 10/2008 | Yamada | H01L 23/4334 |
| | | | 257/E23.092 |
| 9,818,670 B2 * | 11/2017 | Macall | H01L 23/467 |
| 2004/0036137 A1 * | 2/2004 | Gleason | H01L 21/4846 |
| | | | 257/E21.174 |
| 2004/0042177 A1 * | 3/2004 | Geva | H01L 23/4093 |
| | | | 361/705 |
| 2008/0014780 A1 * | 1/2008 | Lin | H05K 7/1053 |
| | | | 257/E23.086 |
| 2008/0230893 A1 | 9/2008 | Too et al. | |
| 2010/0085712 A1 * | 4/2010 | Hrehor, Jr. | H05K 7/20254 |
| | | | 361/699 |
| 2020/0049157 A1 | 2/2020 | Richter | |
| 2021/0068302 A1 | 3/2021 | North et al. | |
| 2023/0324967 A1 | 10/2023 | Ahrens et al. | |

OTHER PUBLICATIONS

PCT/US2023/063347, "International Search Report and Written Opinion", PCT Application No. PCT/US2023/063347, Jun. 13, 2023, 8 pages.
PCT/US2023/014176 , "International Search Report and Written Opinion", PCT Application No. PCT/US2023/014176, Jun. 12, 2023, 8 pages.
U.S. Appl. No. 17/704,862, filed Oct. 24, 2024 , "Restriction Requirement", U.S. Appl. No. 17/704,862, filed Oct. 24, 2024, 5 pages.
23775445.2 , "Foreign Office Action", EP Application No. 23775445.2, Nov. 4, 2024, 3 pages.
23775781.0 , "Foreign Office Action", EP Application No. 23775781.0, Nov. 4, 2024, 3 pages.

\* cited by examiner

LID CARVEOUTS FOR PROCESSOR CONNECTION AND ALIGNMENT

BACKGROUND

Computer processors are often manufactured to include an integrated heat spreader, commonly referred to as the processor's "lid." The lid is typically configured as a housing that serves as a protective shell for processor components (e.g., die). In many implementations, the lid is fabricated from metal such as plated copper to provide a pathway for heat transfer away from the processor components to a thermal dissipation device or heatsink.

BRIEF DESCRIPTION OF THE DRAWINGS

The detailed description is described with reference to the accompanying figures. Entities represented in the figures are indicative of one or more entities and thus reference is made interchangeably to single or plural forms of the entities in the discussion.

DETAILED DESCRIPTION

Overview

Figure 1:
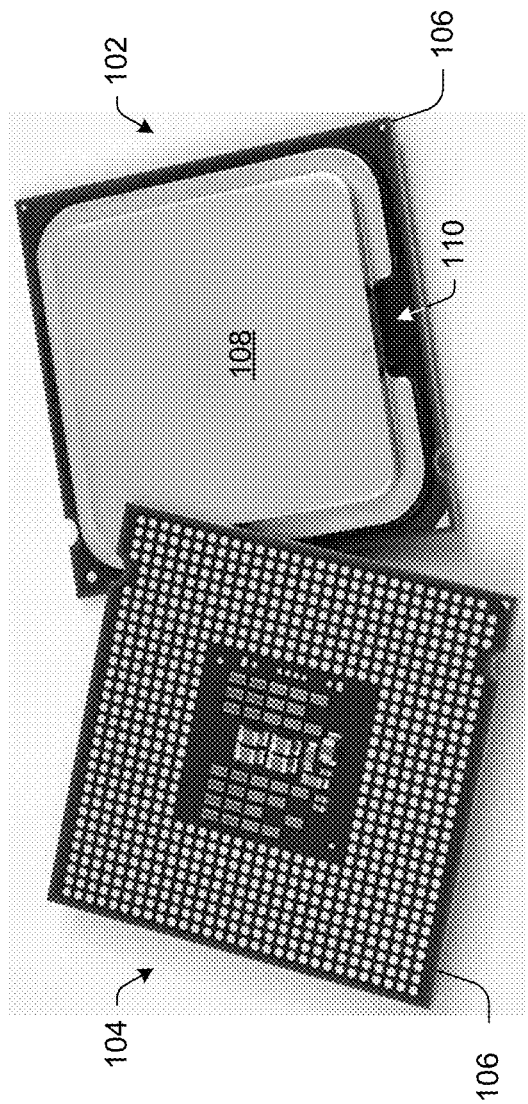
FIG. 1 illustrates an example implementation of a processor configured with a conventional lid.

Processors, integrated circuits, and other semiconductor devices are packaged in a manner that protects internal components (e.g., die) from potentially damaging influences such as contaminants, water damage, light exposure, and so forth. A processor package additionally connects the internal components to an external environment such as a printed circuit board. In some implementations, processors are packaged with an integrated heat spreader, or "lid," configured as a housing that also serves as a pathway for transferring heat away from the internal components.

For instance, processor lids are often configured with a first surface that contacts the internal components and a second surface opposite the first surface that is configured to contact a cooling device, such as a heatsink, a watercooler block, or the like. Conventional approaches for interfacing a processor lid with a cooling device often rely on a press-fit with thermal compound securing the processor lid to a heat transfer surface of the cooling device. These conventional approaches, however, rely on a manual precision of a user installing the cooling device and achieve only general alignment within a large window of imprecision, relative to component internal component areas, potential die hotspots, and so forth. Consequently, this general alignment often results in imprecise alignment where a portion of the cooling device heat transfer surface that is designed to contact or overlap the package lid or a particular area fails to do so.

To increase surface area for heat transfer between processor lid and cooling device, conventional lids are designed to cover a majority of the package, such that an exterior perimeter of the lid often extends to an exterior perimeter of a substrate on which the internal components are disposed. For processors that include multiple die, different portions of the package heat at different rates, depending on processor operation. Conventional lids, however, are configured to provide an even heat transfer surface for an entire package and fail to account for disparate heating rates of the underlying internal components. As a corollary to this conventional lid design, conventional cooling devices fail to account for disparate component heating rates and instead regard the entire package lid as having uniform thermal properties (e.g., due to lack of alignment precision). Therefore, certain cooling devices, such as Peltier coolers, experience problems with condensation by maintaining a cooling solution at a sub-ambient temperature across the entire lid as a consequence of regarding conventional lids as having uniform thermal properties.

Due to conventional processor package design, conventional cooling devices are unable to directly interface with an internal component such as a central processing unit (CPU). For instance, in conventional device configurations, communications between a processor and external environment such as a PCB are routed through a socket adhering the processor to the board. For cooling device control, conventional PCBs include a cooling device header located on the board near the processor socket. In implementations where the cooling device is configured as a fan, the cooling device header provides voltage to power the fan and specify a fan speed during operation.

The communication pathway between the processor socket and the fan header is conventionally a low-speed signaling interface that routes communications through multiple low-speed busses and logic components (e.g., microcontrollers) rather than directly interfacing the fan with the processor. The resulting communications via these conventional pathways are high-latency and low-speed, which limits the processor to only a general understanding of cooling device operation (e.g., a current rate of operation of the cooling device). These low-speed conventional communication pathways between a processor and cooling device further lack the ability to carry sufficient data informing the cooling device as to additional considerations such as particular lid coordinates for targeted processor cooling. Consequently, conventional processor package design results in inefficient heat transfer.

To address these conventional shortcomings, package lids with carveouts configured for processor connection and alignment are described. As described herein, a carveout refers to a portion of an edge of a package lid that recedes from an outer perimeter of the lid. When observed from a top view, each carveout appears as an indentation of an edge of the package lid, such that a portion of the lid edge at the carveout is positioned closer to a center of the package lid than a portion of the lid edge that does not include a carveout. In some implementations, lid carveouts are configured to precisely align and mechanically secure a cooling device to the package lid by receiving protrusions of the cooling device via a press fit connection. As an example, some lid carveouts are dimensioned differently from other lid carveouts, such that a cooling device with protrusions similarly dimensioned is mechanically attachable with the lid in only one orientation.

Because the lid carveouts ensure precise alignment and orientation of a cooling device relative to a package lid, the lid design enables targeted cooling of discrete portions of the lid. As an example, for a current or upcoming processor workload, a processor is aware of which internal components (e.g., which portion of a die underneath the lid) will heat first and at what rate relative to other portions of the die. The processor is further able to take into account how current workloads and operating conditions will affect which components and coordinates are generating heat. When coupled with a cooling device using the lid carveouts described herein, the processor is also informed as to an orientation of the cooling device relative to the processor lid and can thus accurately instruct a cooling deice to focus cooling on a portion of the lid located opposite specific portion(s) of the die that are generating heat gradients. In contrast to conventional lid designs, the lid carveouts described herein enable cooling devices to avoid condensation problems by targeting subambient temperatures to lid portions on an as-needed basis, while maintaining other portions above ambient temperatures to prevent condensation.

In some implementations, lid carveouts expose one or more connectors (e.g., copper pads configured for electrical connection) disposed on a surface of the package that includes the package's internal components. When contacted by corresponding connectors of a cooling device, the lid carveouts enable connections (e.g., electrical connections of a data bus) between the package and the attached cooling device. In some implementations the connectors are wired directly to internal components, such as wired directly to a CPU housed under a package lid. By creating a direct connection between the CPU and an attached cooling device, the lid carveouts enable a high-speed connection configured to pass information directly between CPU control circuitry and cooling device control circuitry, enabling on-demand cooling actuation. This high-speed connection advantageously avoids low-speed communication pathways and passthroughs implemented by conventional processor architectures and enables direct processor control of a cooling device.

For instance, in an example implementation where a processor includes separate CPU portions and graphics processing unit (GPU) portions disposed under a lid, the processor transfers power between the different portions according to a current operating task. Such power transfer is often referred to as "power sloshing," and enables diversion of power from the GPU to the CPU when performing CPU tasks, and vice versa. In implementations, the processor is informed of upcoming tasks and is thus informed as to when additional current will be requested, when frequency will be ramped up, when power will be sloshed between different portions of a die, and so forth. While conventional communication pathways between a processor and a cooling device permit only limited information transfer, the direct connection enabled by the carveout-exposed connectors as described herein permits the processor to transfer adequate information and pre-notify the cooling device of anticipated thermal increases.

Thus, rather than being purely reactive to detecting heat generated at an internal component and propagated through a package lid before initiating cooling, the package lids described herein enable proactive cooling techniques. For instance, using the direct connections exposed by lid carveouts, a CPU instructs a cooling device to pre-cool a lid (e.g., increase fan speed or cooling liquid flow rate before a lid reaches a temperature threshold), perform targeted cooling of a portion of a lid (e.g., concentrate air flow on a portion of a lid or applying extra cooling to a specified portion of a lid), or combinations thereof. This advantageously enables a cooling device to respond to heat before it would have been aware of heat presence using conventional techniques.

Via the direct communication pathway via a processor and cooling device exposed by package lid carveouts, the processor is further provided with additional feedback relative to conventional approaches. For instance, in a conventional implementation where a cooling device is mechanically secured to a processor lid but communicatively coupled to the processor via a fan header, misalignment between the cooling device and processor lid resulting from external forces such as vibration that does not affect the fan header connection are not detected by the processor. In contrast to these conventional configurations, by mechanically securing and directly communicatively coupling the cooling device to the processor lid using lid carveouts, the processor is configured to detect improper alignment when connections exposed by the lid carveouts are not properly connected to corresponding cooling device connections. The package lid carveouts described herein thus advantageously enable mechanical alignment and direct connection between a processor and cooling device not enabled by conventional package lids.

In some examples, the techniques described herein relate to a processing device including: a substrate including at least one processor core and one or more contacts configured to establish an electrical connection with the at least one processor core; and an integrated heat spreader that is bonded to the substrate and covers the at least one processor core, the integrated heat spreader including a plurality of carveouts that expose at least one of the one or more contacts, each of the plurality of carveouts being disposed along an edge of the integrated heat spreader and receding from an outer perimeter of the integrated heat spreader.

In some examples, the techniques described herein relate to a processing device, wherein the at least one processor core includes one or more of a central processing unit, a graphics processing unit, or a parallel accelerated processor.

In some examples, the techniques described herein relate to a processing device, wherein the at least one processor core includes a system management component configured to manage power consumption by the at least one processor core and regulate heat transfer for the processing device by communicating with a cooling device via the one or more contacts.

In some examples, the techniques described herein relate to a processing device, wherein the plurality of carveouts are configured to enable a press fit connection between a cooling device and the at least one of the one or more contacts exposed by the plurality of carveouts.

In some examples, the techniques described herein relate to a processing device, wherein the integrated heat spreader includes a first surface configured to contact the at least one processor core and a second surface that is disposed opposite the first surface and configured for transferring heat away from the at least one processor core by contacting a cooling device.

In some examples, the techniques described herein relate to a processing device, wherein each of the plurality of carveouts include an additional surface oriented approximately perpendicular to the first surface and the second surface, the additional surface being configured to mechanically align the integrated heat spreader with a protrusion of a cooling device and transfer heat to the protrusion of the cooling device.

In some examples, the techniques described herein relate to a processing device, wherein the at least one processor core is configured to determine, prior to execution of an operation, that execution of the operation will increase a temperature of the at least one processor core and instruct, prior to execution of the operation, a cooling device to initiate cooling of the integrated heat spreader responsive to determining that the execution of the operation will increase the temperature of the at least one processor core.

In some examples, the techniques described herein relate to a processing device, wherein the at least one processor core is configured to instruct the cooling device to initiate cooling of the integrated heat spreader by transmitting an instruction to a controller of the cooling device via the one or more contacts.

In some examples, the techniques described herein relate to a processing device, wherein the at least one processor core is configured to instruct a cooling device to initiate targeted cooling of a portion of a surface of the integrated heat spreader, wherein the portion of the surface of the integrated heat spreader is located at a same position relative to the substrate as the at least one processor core.

In some examples, the techniques described herein relate to a processing device, wherein the at least one processor core instructs the cooling device to initiate targeted cooling of the portion of the surface of the integrated heat spreader by concentrating air flow on the portion of the surface of the integrated heat spreader at an increased rate relative to air flow on at least one other portion of the surface of the integrated heat spreader.

In some examples, the techniques described herein relate to a processing device, wherein the substrate is silicon, the one or more contacts are surface mount empty pads, and the integrated heat spreader is plated copper.

In some examples, the techniques described herein relate to a method including: determining, by a processor, that performance of an operation will cause the processor to reach a temperature threshold; detecting, by the processor, performance of the operation; and causing, by the processor, a cooling device to initiate cooling of the processor by transmitting instructions via an electrical contact disposed on a substrate of the processor and contacting an electrical contact of the cooling device.

In some examples, the techniques described herein relate to a method, wherein detecting performance of the operation and causing the cooling device to initiate cooling of the processor are performed prior to the processor initiating performance of the operation.

In some examples, the techniques described herein relate to a method, wherein the processor includes a lid with a plurality of carveouts that are each disposed along an edge of the lid and recede from an outer perimeter of the lid, wherein one of the plurality of carveouts exposes the electrical contact disposed on the substrate of the processor.

In some examples, the techniques described herein relate to a method, wherein the cooling device includes a plurality of protrusions that mechanically align the cooling device with the lid using the plurality of carveouts.

In some examples, the techniques described herein relate to a method, wherein the electrical contact of the cooling device is disposed on one of the plurality of protrusions.

In some examples, the techniques described herein relate to a method, further including causing the cooling device to increase cooling of the processor responsive to determining that the processor will reach an additional temperature threshold.

In some examples, the techniques described herein relate to a method, further including determining that performance of the operation will cause an internal component of the processor to reach the temperature threshold, wherein causing the cooling device to initiate cooling of the processor includes instructing the cooling device to target a portion of a lid of the processor disposed above a portion of the substrate that includes the internal component of the processor.

In some examples, the techniques described herein relate to a method, further including outputting a notification indicating a cooling device alignment error responsive to detecting a disconnect between the electrical contact disposed on the substrate and the electrical contact of the cooling device.

In some examples, the techniques described herein relate to a system including: a processing device including: a substrate with at least one processor core and one or more contacts; and an integrated heat spreader that is bonded to the substrate and covers the at least one processor core, the integrated heat spreader including a plurality of carveouts that expose the one or more contacts; and a cooling device including a plurality of protrusions that mechanically align the cooling device with the processing device, at least one of the FIG. 1 plurality of protrusions configured to establish an electrical connection with the at least one processor core using the one or more contacts.

FIG. 1 illustrates an example implementation of a processor 100 configured with a conventional lid. The illustrated example depicts a top portion 102 and a bottom portion 104 of the processor 100. The bottom portion 104 includes a plurality of pins disposed on a substrate 106 (e.g., silicon) for the processor. The plurality of pins included on the bottom portion 104 are configured to be contacted by corresponding pins of a processor socket adhered to an external environment, such as a computing device motherboard. In conventional processor designs, the plurality of pins included on the bottom portion 104 are the exclusive means by which the processor communicates with the external environment, such that processor inputs and outputs are routed through the processor socket.

The top portion 102 includes a lid 108 disposed on the substrate 106 opposite a side of the substrate 106 including the plurality pins. The lid 108 is configured as an integrated heat spreader that protects internal components (e.g., die) of the processor 100 from overheating by dissipating heat generated by the internal components across a surface area of the lid 108. The flat large flat surface of the lid 108 is conventionally configured as a plated copper plate and configured to contact a corresponding heat transfer surface of a cooling device such as a heatsink, a liquid cooling plate, and so forth.

In many conventional processors, the lid 108 is secured to the substrate 106 using an adhesive (e.g., an epoxy compound) that bonds the lid 108 to the substrate 106. Some conventional processors include a gap 110 that allows venting of heat and trace gasses and avoids harmful pressure buildup while the adhesive cures. However, in contrast to the processor lids described herein, the gap 110 included in conventional processors is not configured for mechanical alignment of a cooling device with the lid 108 and does not avail a communicative connection between the cooling device and internal processor components.

Figure 2:
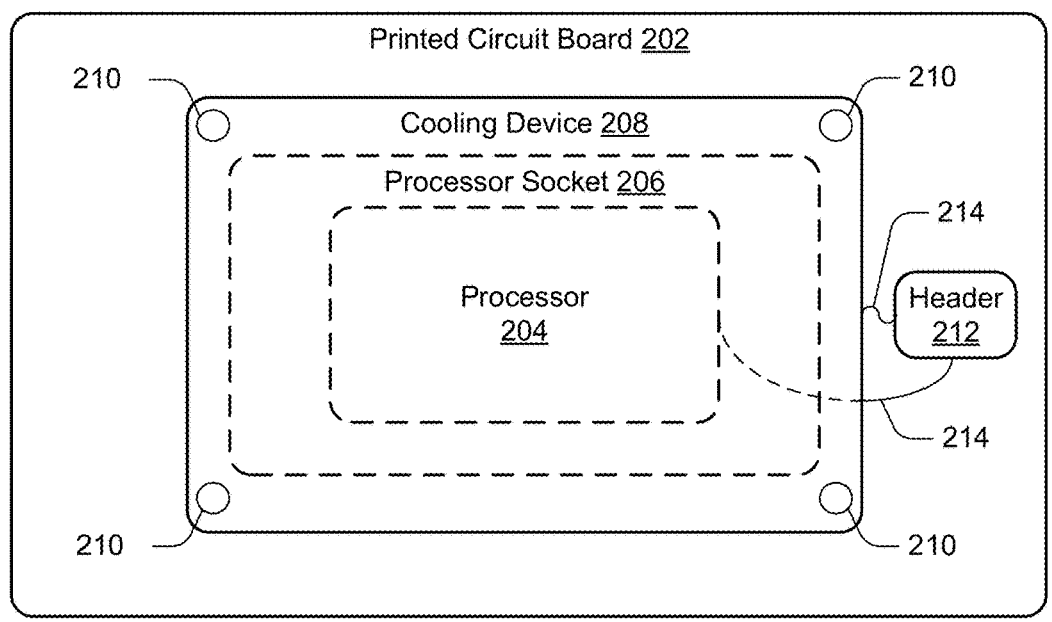
FIG. 2 illustrates an example implementation of a printed circuit board that includes a processor and a cooling device in accordance with one or more conventional implementations.

FIG. 2 illustrates an example 200 of a printed circuit board 202 that includes a processor 204 connected to the printed circuit board 202 via a processor socket 206 and a cooling device 208 in accordance with one or more conventional implementations. Specifically, the illustrated example 200 depicts a top view of the printed circuit board 202. The processor 204 is depicted as being disposed within the processor socket 206, which necessarily occupies a larger footprint of the printed circuit board 202 relative to a footprint of the processor 204 to receive and retain the processor 204. There are various conventional methods for mechanically coupling the cooling device 208 with the processor 204 in a manner that enables heat transfer. For instance, thermal tape or thermal epoxy are conventional solutions that provide an adhesive bond between the processor 204 and the cooling device 208. However, thermal tape and thermal epoxy rely on the manual precision of a user installing the cooling device and often result in misalignment between the processor 204 and the cooling device 208 due to human error and imprecision.

As an alternative, some conventional methods for attaching the cooling device 208 to the processor 204 rely on mechanical attachment points that couple the cooling device 208 directly to the printed circuit board 202, such as attachment points 210. In implementations, attachment points 210 are configured as holes or anchor points in the printed circuit board 202 configured to retain clips, threaded fasteners, push pins, and so forth that secure the cooling device 208 to the printed circuit board 202. While conventional approaches that leverage attachment points 210 provide more reliable alignment between the cooling device 208 and the processor 204 relative to adhesive-only solutions such as thermal tape or thermal epoxy, the resulting footprint requires a keep-out area that prevents other printed circuit board 202 components from being disposed within an area encompassed by the cooling device 208.

For instance, the illustrated example 200 depicts a keep-out area where a footprint of the cooling device 208 encompasses footprints of both the processor socket 206 and the processor 204, preventing other components of the printed circuit board 202 from being positioned in an area having corners defined by the attachment points 210. The illustrated example 200 further depicts a conventional connection between the processor 204 and the cooling device 208. In the illustrated example, the printed circuit board 202 includes a header 212 configured to establish a connection via the processor 204 and the cooling device 208 via wires 214.

The wires 214 are representative of a low-speed signaling interface that routes communications through multiple low-speed busses and logic components (e.g., microcontrollers) rather than directly interfacing the cooling device 208 with the processor 204. These low-speed conventional communication pathways between the processor 204 and cooling device 208 restrict the processor 204 to only a general understanding of cooling device 208 operation and lack the ability to carry sufficient data informing the cooling device 208 as to advanced considerations such as targeted processor cooling. Consequently, conventional processor package design suffers from imprecise alignment and inefficient heat transfer and communications between processors and cooling devices.

Figure 3:
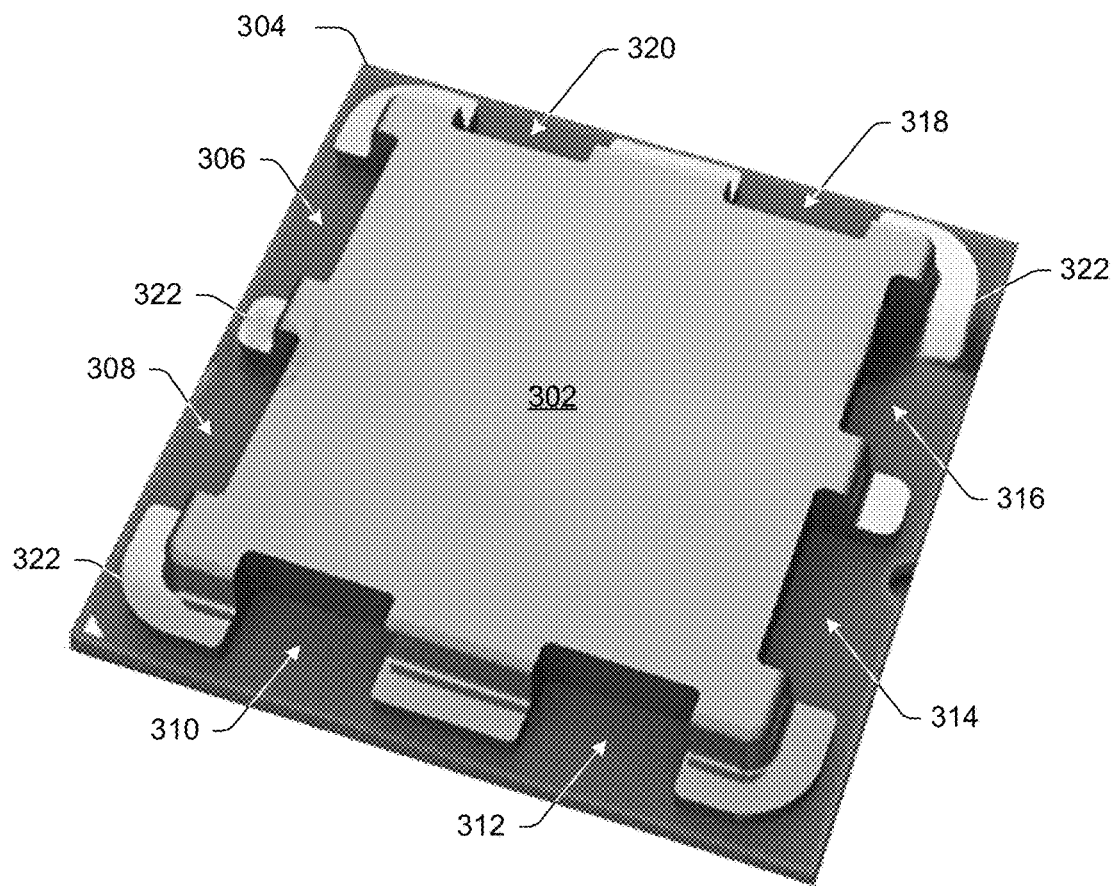
FIG. 3 illustrates an example of a processor with a lid including carveouts for connection and alignment.

FIG. 3 illustrates an example of a processor 300 with a lid including carveouts for connection with and alignment of a cooling device. In the illustrated example, the processor 300 includes a lid 302. The lid 302 is configured as an integrated heat spreader for the processor 300, which is bonded to a substrate 304 that includes at least one internal component of the processor 300. In some implementations, the substrate 304 is configured as silicon that includes at least one processor core implemented in a die disposed on a surface of the substrate 304 to which the lid 302 is bonded. The at least one processor core is representative of a CPU, a GPU, a parallel accelerated processor, a plurality of microprocessors, one or more microprocessors in association with a digital signal processor (DSP) core, a controller, a microcontroller, Application Specific Integrated Circuits (ASICs), Field Programmable Gate Arrays (FPGAs) circuits, any other type of integrated circuit (IC), and/or a state machine, or combinations thereof.

The lid 302 is further depicted as including a plurality of carveouts disposed along an edge of the lid 302 connected to the substrate 304. Specifically, in the illustrated example lid 302 is depicted as including carveout 306, carveout 308, carveout 310, carveout 312, carveout 314, carveout 316, carveout 318, and carveout 320. Each carveout 306, 308, 310, 312, 314, 316, 318, and 320 is configured as receding from an outer perimeter of the lid 302, denoted by edge 322, to create an indentation in the lid 302. In some implementations, one or more carveouts are dimensioned differently from other carveouts in the lid 302. For instance, in some implementations each carveout 306, 308, 310, 312, 314, 316, 318, and 320 is dimensioned as spanning a different length of an edge of the lid 302 and receding at a different depth towards an axis parallel to the edge of the lid 302 that intersects a center point of the lid 302. In such implementations, each carveout 306, 308, 310, 312, 314, 316, 318, and 320 is configured to receive a protrusion of a cooling device having complementary dimensions, such that the cooling device is mechanically forced to align with the lid 302 in only a single possible orientation. Alternatively, in some implementations different carveouts have common dimensions with one another. For instance, in some implementations carveouts 306, 308, 314 and 316 have a first set of common dimensions (e.g., indentation width and depth) and carveouts 310, 310, 318, and 320 have a second set of common dimensions (e.g., indentation width and depth), such that a cooling device with corresponding protrusions is permitted to mechanically align with the processor 300 in one of two possible orientations. For a more detailed view depicting how a lid with carveouts mechanically aligns a cooling device with a processor's internal components, consider FIG. 4.

Figure 4:
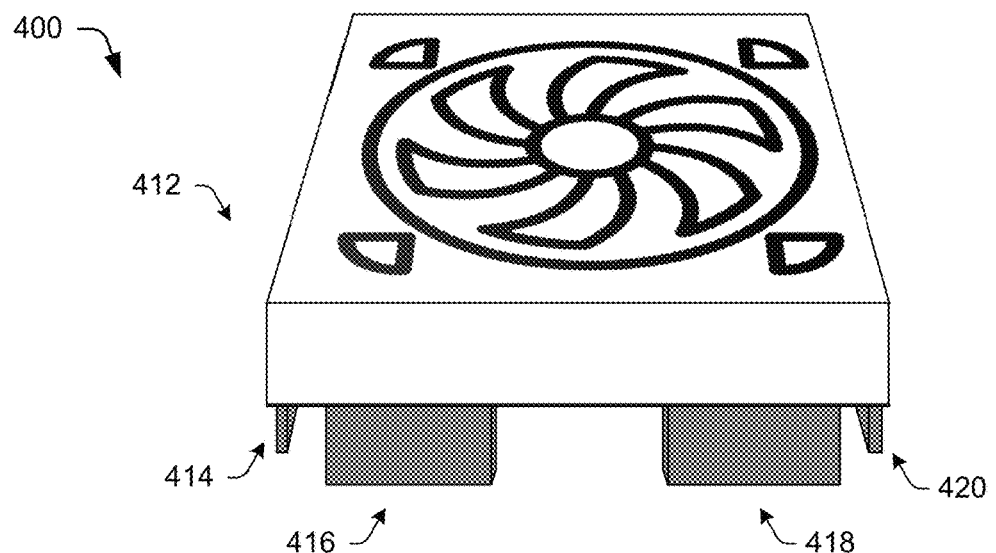
FIG. 4 illustrates an exploded view of an example device that includes a processor substrate, a processor lid with carveouts, and a processor cooling device.
Figure 4:
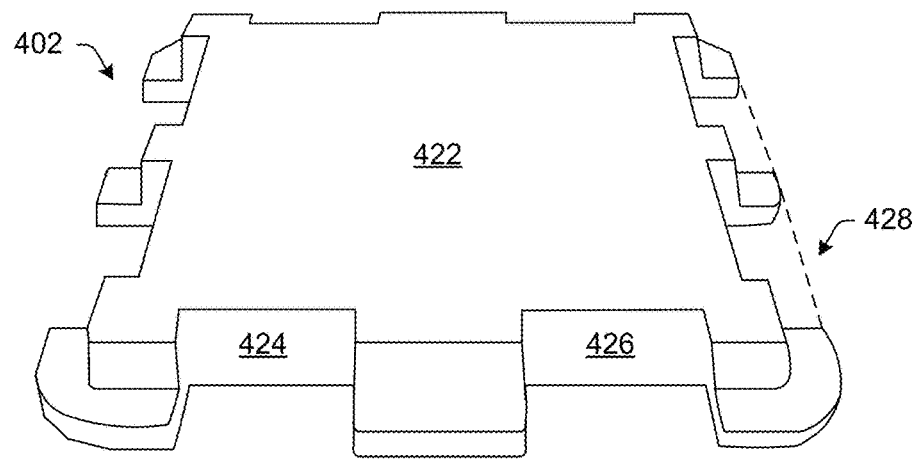
Figure 4:
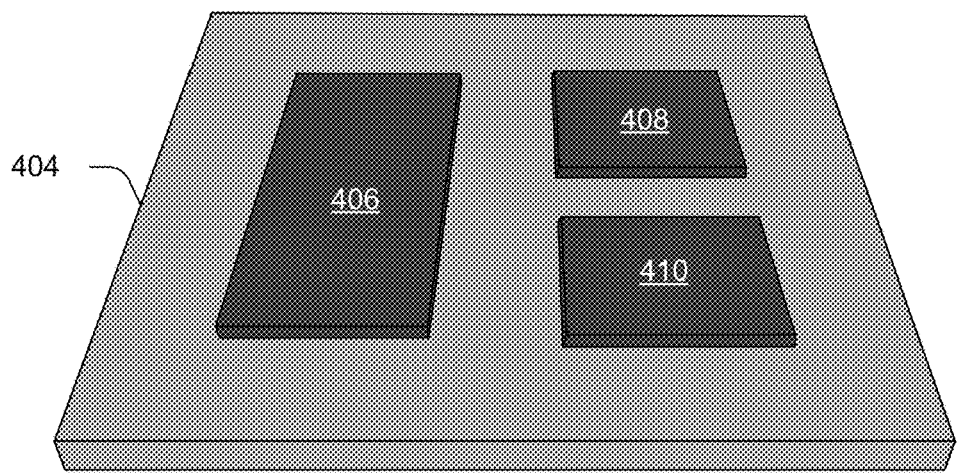

FIG. 4 illustrates an exploded view of an example device 400 that includes a processor lid 402 that includes carveouts and is configured for attachment to a processor substrate 404. The processor substrate 404 is illustrated as including internal component 406, internal component 408, and internal component 410. In some implementations, internal component 406 is configured as an input/output die that includes one or more GPU components and is configured to communicate with memory locations leveraged by the processor. In some implementations, internal component 408 is representative of a hardware cache configured to store copies of data from frequently used memory locations. In some implementations, internal component 410 is representative of one or more processor cores, such as a CPU, a GPU, a parallel accelerated processor, a plurality of microprocessors, one or more microprocessors in association with a DSP core, a controller, a microcontroller, ASICs, FPGAs circuits, any other type of IC, and/or a state machine.

The processor lid 402 is configured to protect and provide heat transfer for the internal components 406, 408, and 410 by mechanically aligning a cooling device 412 with the processor substrate 404 via carveouts included in the processor lid 402. For instance, the processor lid 402 is representative of an instance of the lid 302 with its carveouts 306, 308, 310, 312, 314, 316, 318, and 320. One or more of the processor lid 402 carveouts are configured to mechanically align and secure the cooling device 412 to the processor lid 402 by receiving a corresponding one or more protrusions of the cooling device 412. For instance, in the illustrated example of FIG. 4, the exploded view of device 400 depicts four protrusions extending from the cooling device 412: protrusion 414, protrusion 416, protrusion 418, and protrusion 420.

In an example implementation where the processor lid 402 is configured as the lid 302 illustrated in FIG. 3, the protrusion 414 is configured to be mechanically aligned with and secured by carveout 308 when the cooling device 412 is coupled with the processor lid 402. Similarly, protrusion 416 is dimensioned as complementing carveout 310, protrusion 418 is dimensioned as complementing carveout 312, and protrusion 420 is dimensioned as complementing carveout 314. In this example implementation, the processor lid 402 carveouts and cooling device 412 protrusions are dimensioned such that the cooling device 412 is permitted to contact a heat transfer surface 422 of the processor lid 402 in a known alignment orientation. The heat transfer surface 422 is representative of a surface of the processor lid 402 disposed opposite a surface of the processor lid 402 configured to contact the internal components 406, 408, and 410, thereby conducting heat from the internal components 406, 408, and 410 to a corresponding surface of the cooling device 412 that contacts the heat transfer surface 422.

To further improve heat transfer away from the internal components 406, 408, and 410, the carveouts increase a surface area of the processor lid 402 in contact with the cooling device 412. For instance, surface 424 is representative of a surface of carveout 310 that is approximately perpendicular to the heat transfer surface 422 that contacts a surface of the protrusion 416 when mechanically aligning and securing the cooling device 412 with the processor lid 402. In a similar manner, surface 426 is representative of a surface of carveout 312 that is approximately perpendicular to the heat transfer surface 422 that contacts a surface of the protrusion 418 when the cooling device 412 and processor lid 402 are mechanically aligned and secured with one another. The additional area of surface 424 and surface 426 contacting the respective protrusions 416 and 418 provide an additional means by which the processor lid 402 conducts heat from the internal components 406, 408, and 410 to the cooling device 412, thus enabling more efficient heat transfer relative to conventional lid designs.

As an additional advantage relative to conventional processor lids, because the carveouts recede from an outer perimeter of the processor lid 402, represented by the dashed line 428 in the illustrated example of FIG. 4, the processor lid 402 enables mechanical alignment and connection with the cooling device 412 even when the cooling device 412 has a smaller footprint than a footprint of the processor lid 402 or processor substrate 404. For instance, in contrast to the keep-out area required by conventional processor lid designs as illustrated in FIG. 2, the processor lid 402 provides secure and precise mechanical alignment of a cooling device 412 independent of one or more attachment points of a circuit board to which the device 400 is attached, enabling implementation in more compact devices and reducing a requisite PCB size for accommodating the device 400.

Figure 5:
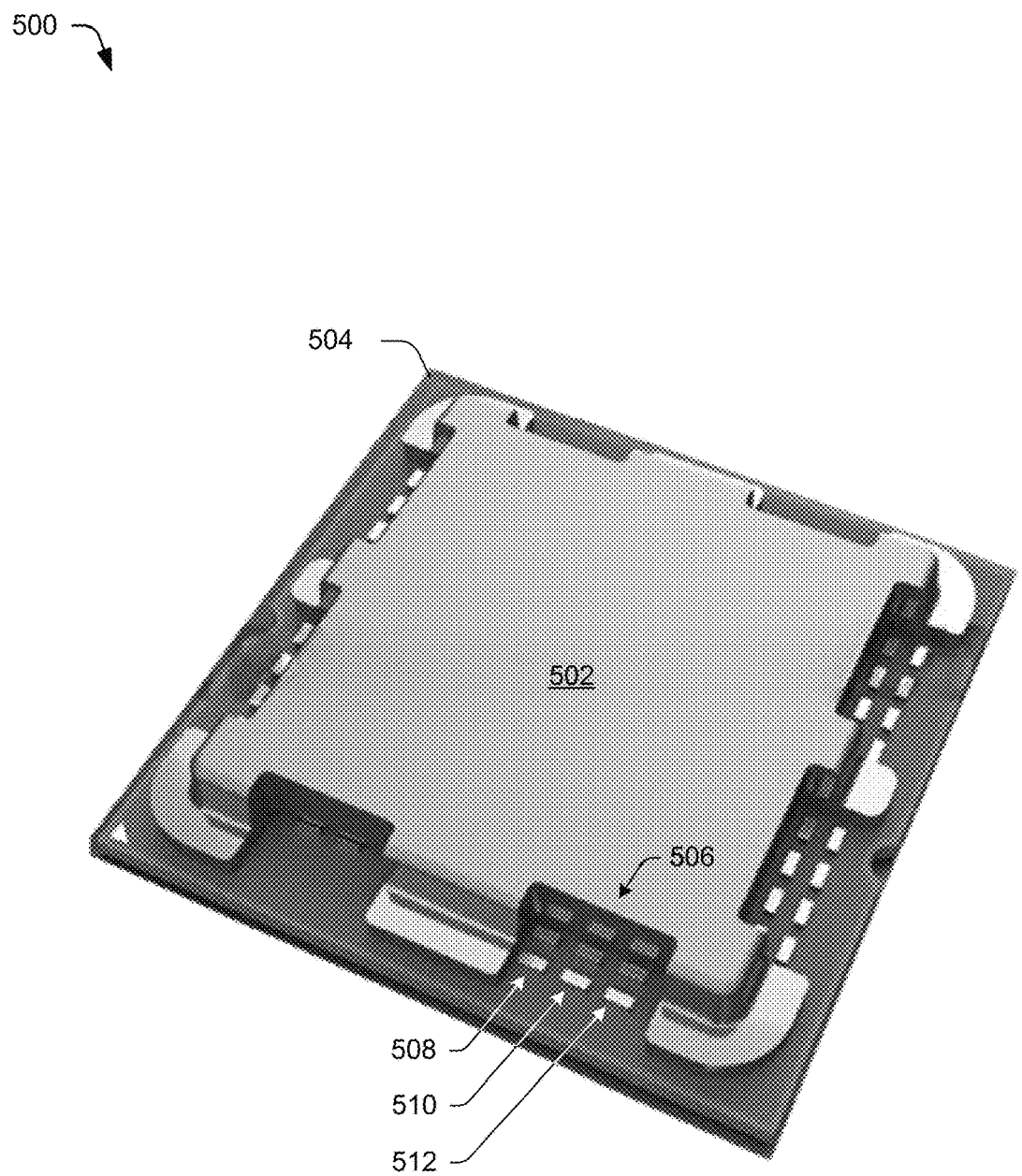
FIG. 5 illustrates an example of a processor with a lid including carveouts exposing connections of a processor substrate.

Another advantage offered by a processor lid including carveouts as described herein is the exposure of contacts disposed on a surface of a processor substrate protected by the processor lid. For instance, FIG. 5 illustrates an example of a processor 500 with a lid 502 including carveouts exposing connections of a processor substrate 504. In the illustrated example, lid 502 is depicted as including a plurality of carveouts, such as carveout 506. Carveout 506 proves an indentation recessed from an outer perimeter of the lid 502 that exposes contact 508, contact 510, and contact 512, which would have otherwise been covered by the lid 502 absent the carveout 506. In some implementations, the contact 508, contact 510, and contact 512 are each configured as a surface mount empty pad connected to an internal component of the processor 500, such as a CPU, via one or more pathways embedded in the processor substrate 504. Although described and illustrated herein in the context of being surface mount empty pads, the contacts 508, 510, and 512 are representative of any suitable type of component configured to establish a connection with an internal component (e.g., CPU) of the processor 500, such as one or more pads disposed on the processor substrate 504.

In some implementations, the contacts 508, 510, and 512 are designed to establish an electrical connection between the internal component (e.g., CPU) of the processor 500 and a cooling device. For instance, consider an implementation with respect to the previously described examples where the lid 502 represents an instance of lid 302, such that carveout 506 corresponds to carveout 312 and is configured to receive protrusion 418 of the cooling device 412. In this implementation, the contacts 508, 510 and 512 are configured to establish an electrical connection with corresponding contacts disposed on a surface of the protrusion 418 that contacts the processor substrate 404 when mechanically aligned and secured with the processor lid 402. Via the electrical connections enabled by contacts 508, 510, and 512, a high-speed data bus communicatively coupling the internal components of the processor 500 (e.g., one or more of the internal components 406, 408, or 410) and the cooling device 412 is established. In this manner, carveouts of the lid 502 enable an internal component of the processor 500 to directly control and receive feedback from a cooling device secured to the processor 500 via the lid 502.

Figure 6:
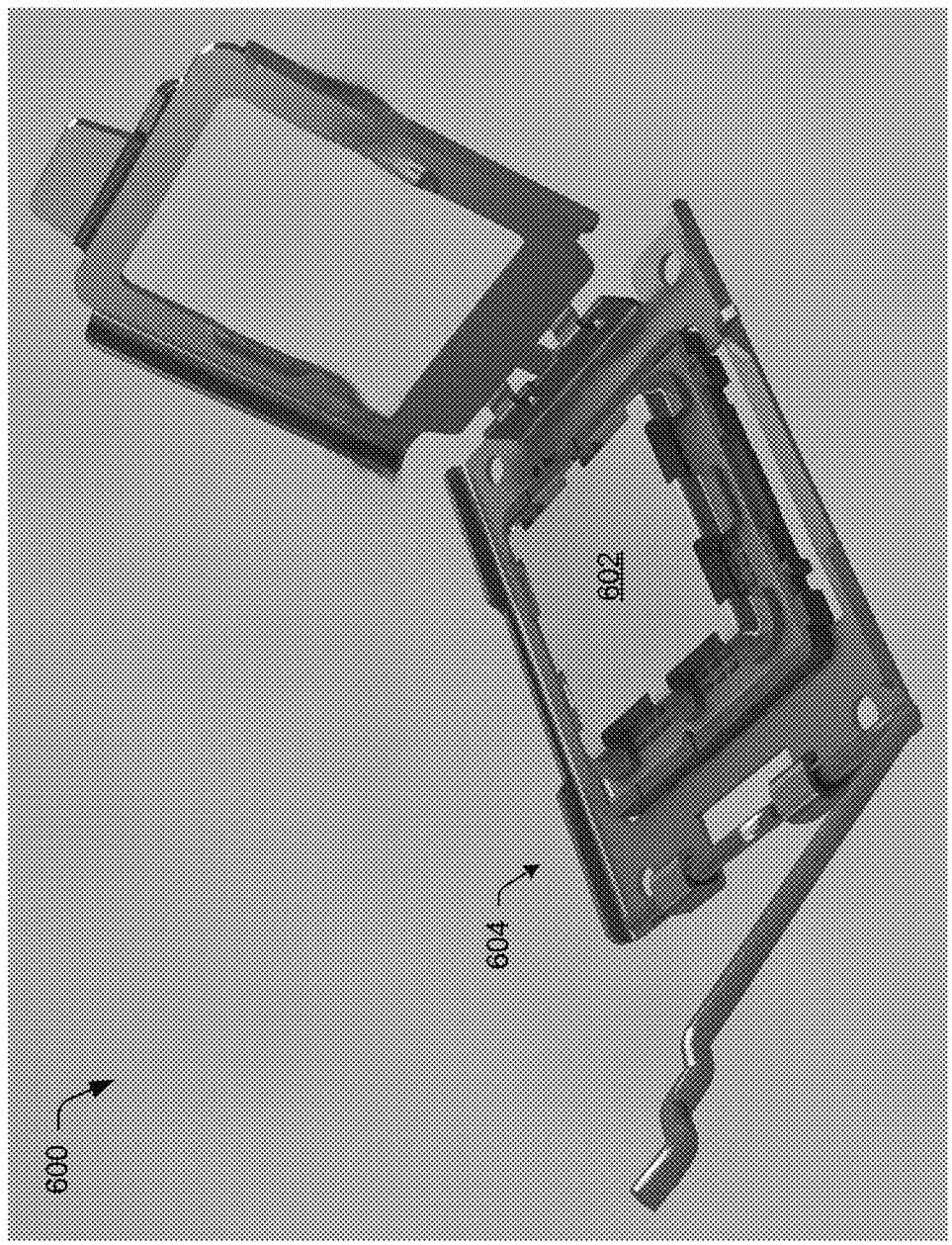
FIG. 6 illustrates an example of a processor with a lid including carveouts disposed in an open socket.
Figure 7:
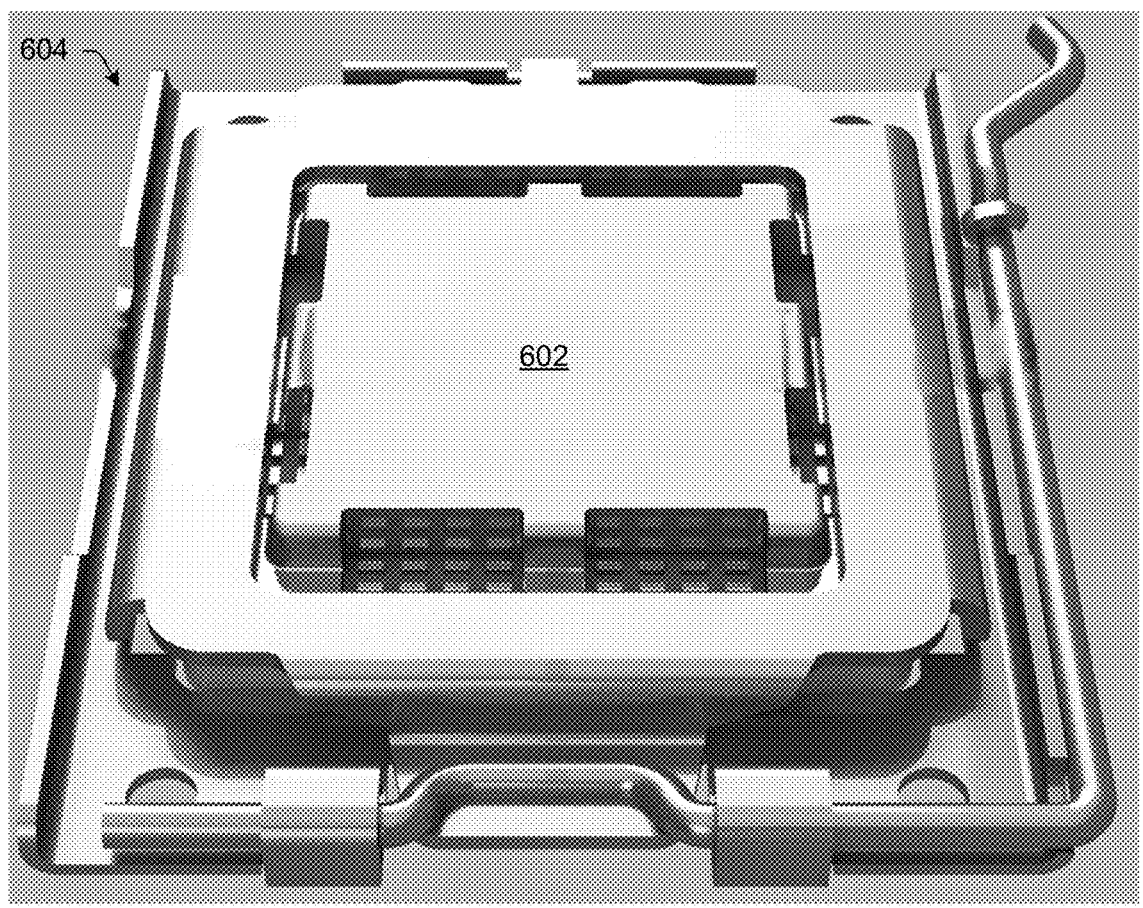
FIG. 7 illustrates an example of a processor with a lid including carveouts secured within a socket.

The lid carveouts described herein are configured to enable secure mechanical alignment of, and communicative coupling between, a cooling device and a processor when the processor is inserted into a socket that connects the processor to an external environment such as a printed circuit board. For instance, FIGS. 6 and 7 illustrate examples of a processor that includes a lid with carveouts described herein as disposed in a processor socket. In the illustrated example 600 of FIG. 6, a processor 602 including a lid having carveouts configured to align and secure a cooling device is depicted as inserted into a processor socket 604 while the processor socket is in an open position. In some implementations, the processor socket 604 is representative of a zero-insertion force (ZIF) socket configured to connect the processor 602 to an external environment and retain the processor 602 when the processor socket 604 is in a closed position. The illustrated example 700 of FIG. 7 depicts the processor socket 604 in a closed position that retains the processor 602. As visible from the illustrated example 700, while an external lid perimeter of the processor 602 is covered by a retention cover of the processor socket 604 in the closed position, the lid carveouts recede to a sufficient degree configured for receiving protrusions of a cooling device and establishing a direct connection between internal components of the processor 602 and the cooling device.

Figure 8:
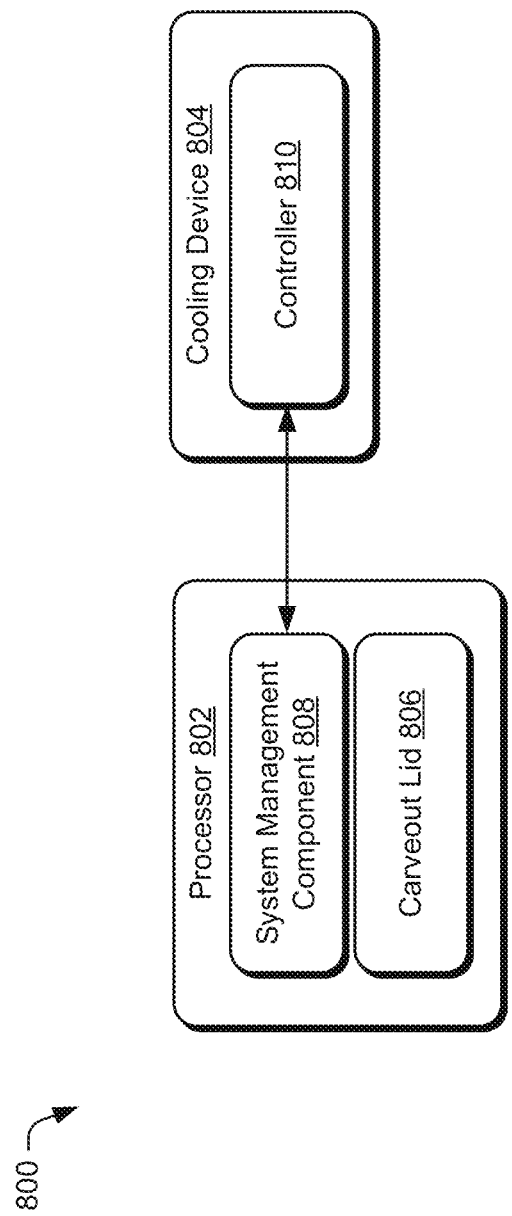
FIG. 8 is an illustration of a digital medium environment in which a processor directly communications with a cooling device enabled via at least one connection exposed by a lid carveout.

FIG. 8 is an illustration of a digital medium environment 800 in which a processor 802 directly communications with a cooling device 804 via at least one connection exposed by a lid carveout. In the illustrated example of FIG. 8, processor 802 is depicted as including a carveout lid 806, which is representative of one of the lids 302, 402, or 502 described herein. The processor 802 is further depicted as including a system management component 808. The system management component 808 is representative of a functionality of the processor 802 configured to manage power consumption by one or more processor cores included in the processor 802 and regulate heat transfer by communicating with the cooling device 804 via one or more contacts exposed by carveouts of the carveout lid 806.

To do so, the system management component 808 transmits data to, and receives data from, a controller 810 of the cooling device 804. The arrows connecting the system management component 808 and the controller 810 are representative of a communication pathway established between an internal component of the processor 802 and the cooling device 804 using contacts disposed on a substrate of the processor 802 exposed by the carveout lid 806 that communicatively couple with contacts disposed on one or more protrusions of the cooling device 804.

Because the system management component 808 is representative of functionality of the processor 802 that controls voltages supplied to various components of the processor 802, dictates what operations individual processor cores are performing at a given time, what frequencies are applied, and so forth, the system management component 808 is configured to control and dynamically change an operating environment of the processor 802 based on a current or an upcoming task. For instance, the system management component 808 is configured to monitor the loading of all processor components and dynamically change the frequency and voltage of each individual component while simultaneously monitoring the component's instantaneous and sustained power consumption and temperature. The system management component 808 is further configured to access preprogrammed modeled information describing different combinations of voltage, current, and power levels for a given circuitry configuration influence temperature. In some implementations, the system management component 808 is configured to obtain feedback in real-time describing temperatures of different processor components, such as from thermal diodes integrated into the processor 802, from thermocouples distributed across the cooling device 804, and so forth.

Consequently, the system management component 808 is informed as to both current tasks being performed by discrete components of the processor 802 as well as upcoming tasks for performance by the discrete components. Given this information, the system management component 808 is configured to anticipate whether a processor 802 component will satisfy a temperature threshold during performance of an operation, prior to initiating performance of the operation. Via the direct communication between the system management component 808 and the controller 810, the system management component 808 is configured to preemptively instruct the cooling device 804 to initiate cooling of the carveout lid 806, perform targeted cooling on a portion of the carveout lid 806 that corresponds to the component scheduled to perform the operation, or combinations thereof.

For instance, the system management component 808 is configured to anticipate that a processor core of the processor 802 will satisfy a temperature threshold during performance of an upcoming operation. Because the cooling device 804 is mechanically aligned with the processor 802 via the carveout lid 806 in a known orientation, the system management component 808 is configured to instruct the cooling device 804 to initiate targeted cooling of a portion of a surface of the carveout lid 806 disposed above the processor core. A specific manner in which the cooling device 804 is instructed to perform targeted cooling of the portion of the surface of the carveout lid 806 is dependent on a configuration of the cooling device 804. For instance, in an implementation where the cooling device 804 is configured to effect heat transfer via forced air, the system management component 808 is configured to instruct the cooling device 804 to concentrate air flow on the portion of the surface of the carveout lid 806 corresponding to the processor core at an increased rate relative to air flow on at least one other portion of the surface of the carveout lid 806.

The system management component 808 is further configured to receive data from the controller 810 and take action based on a current state of the cooling device 804. For instance, the system management component 808 is configured to monitor the electrical connection between the processor 802 and the controller 810 and detect a disconnect between contacts connecting the processor 802 and the cooling device 804. As an example, in an implementation where external forces such as vibration cause cooling device 804 misalignment, the system management component 808 is configured to output a notification (e.g., a visual indication via one of more lights connected to the processor 802, an audible notification, or combinations thereof indicating a cooling device alignment error). In this manner, the carveout lid 806 enables the processor 802 to detect problems that would otherwise go undetected using conventional lid designs and generate alerts for remedying the problems.

The following discussion describes techniques that are implemented utilizing the previously described systems and devices. Aspects of the procedure are implemented in hardware, firmware, software, or a combination thereof. The procedure is shown as a set of blocks that specify operations performed by one or more devices and are not necessarily limited to the orders shown for performing the operations by the respective blocks. Furthermore, although various operations performed by one or more devices are recited, the techniques discussed herein additionally or alternatively include additional operations. In portions of the following discussion, reference is made to FIGS. 3-8.

Figure 9:
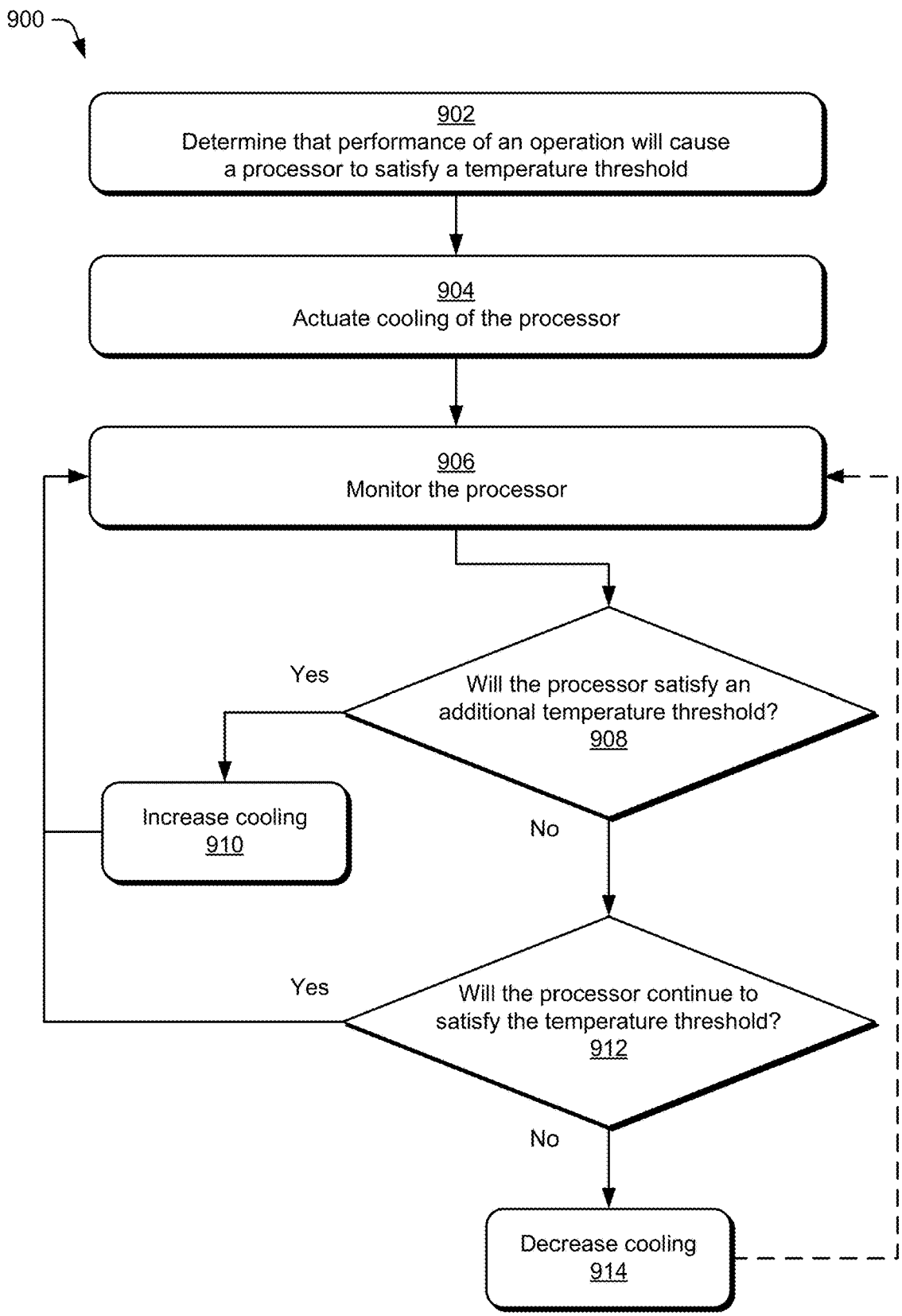
FIG. 9 is a flow diagram depicting a procedure in an example implementation of a processor directly communicating with a cooling device enabled via at least one connection exposed by a lid carveout.

FIG. 9 is a flow diagram 900 depicting a procedure in an example implementation of a processor directly communicating with a cooling device enabled via at least one connection exposed by a lid carveout. In some implementations, operations of the flow diagram 900 are performed by an internal component of a processor, such as the system management component 808 of processor 802.

In the procedure of FIG. 9, it is determined that performance of an operation will cause a processor to satisfy a temperature threshold (block 902). The system management component 808, for instance, determines that an internal component of the processor 802 is performing an operation, or will be performing an operation, that is likely to cause the internal component to heat to the temperature threshold. In implementations, the temperature threshold is dependent on a computing device implementing the processor. Alternatively or additionally, the temperature threshold is dependent on the internal component, such that different internal components are associated with different temperature thresholds.

Responsive to determining that performance of the operation will cause the processor to satisfy the temperature threshold, cooling of the processor is actuated (block 904). The system management component 808, for instance, transmits instructions to a cooling device 804 attached to the processor 802 to initiate cooling of the processor 802. In some implementations, the instructions for actuating cooling of the processor 802 are transmitted via a direct connection between the system management component 808 and a controller 810 of the cooling device 804 that is established via electrical connections exposed by a carveout lid 806 of the processor 802. For instance, the processor 802 includes contacts 508, 510, and 512 that are configured to establish an electrical connection with contacts disposed on a protrusion 418 of the cooling device 804 when the cooling device 804 is mechanically aligned and secured with the carveout lid 806. In some implementations, the instructions for actuating cooling of the processor 802 specify a discrete location of the carveout lid 806 for targeted cooling by the cooling device 804.

After actuating cooling of the processor, the processor is monitored (block 906). The system management component 808, for instance, continues to monitor the processor 802 and determine both current and upcoming workloads to perform various processor functions. As part of monitoring the processor, a determination is made as to whether the processor will satisfy an additional temperature threshold (block 908). In response to determining that the processor will satisfy an additional temperature threshold, cooling of the processor is increased (block 910). The system management component 808, for instance, determines that a current and/or upcoming operation of the processor is likely to satisfy an additional temperature threshold an instructs the cooling device 804 to increase cooling of the processor 802. For forced air implementations, the system management component 808 instructs the cooling device 804 to increase a fan speed, concentrate air flow, and/or direct additional cooling power to a designated portion of the carveout lid 806. For liquid cooling implementations, the system management component 808 instructs the cooling device 804 to increase a cooling liquid flow rate. For cryogenic implementations, the system management component 808 instructs the cooling device 804 to increase a current at a portion, portions, or an entirety of one or more heat transfer surfaces of the carveout lid 806. For thermoelectric cooling implementations, the system management component 808 instructs the cooling device 804 to create a heat flux (e.g., using the Peltier effect) to increase cooling at a designated portion, portions, or an entirety of one or more heat transfer surfaces of the carveout lid 806. For phase change cooling implementations, the system management component 808 instructs the cooling device 804 to change the state of a thermally conductive medium at a designated portion, portions, or entirety of one or more heat transfer surfaces of the carveout lid 806. After increasing cooling of the processor, operation returns to monitoring the processor, as represented by the arrow returning to block 906 from block 910.

Alternatively, in response to determining that the processor will not satisfy an additional temperature threshold, a determination is made as to whether the processor will continue to satisfy the temperature threshold (block 912). In response to determining that the processor will continue to satisfy the temperature threshold, operation returns to monitoring the processor, as represented by the arrow returning to block 906 from block 912.

Alternatively, in response to determining that the processor will not continue to satisfy the temperature threshold, cooling of the processor is decreased (block 914). The system management component 808, for instance, instructs the cooling device 804 to decrease cooling of a portion, portions, or an entirety of one or more heat transfer surfaces of the carveout lid 806. For forced air implementations, the system management component 808 instructs the cooling device 804 to decrease a fan speed and/or reduce concentration of air flow on a designated portion of the carveout lid 806. For liquid cooling implementations, the system management component 808 instructs the cooling device 804 to decrease a cooling liquid flow rate. For cryogenic implementations, the system management component 808 instructs the cooling device 804 to decrease a current at a portion, portions, or an entirety of one or more heat transfer surfaces of the carveout lid 806. After increasing cooling of the processor, operation returns to monitoring the processor, as represented by the arrow returning to block 906 from block 910. In some implementations, operation returns to monitoring the processor, as indicated by the dashed arrow returning to block 906 from block 914. Alternatively, in implementations where no further cooling of the processor is needed (e.g., in response to detecting system shutdown and/or heat reduction below the temperature threshold) the system management component 808 instructs the cooling device 804 to cease cooling of the processor 802.

Although features and elements are described above in particular combinations, each feature or element is usable alone without the other features and elements or in various combinations with or without other features and elements. In this manner, many variations are possible based on the disclosure herein.

The various functional units illustrated in the figures and/or described herein are implemented in any of a variety of different manners such as hardware circuitry, software executing or firmware executing on a programmable processor, or any combination of two or more of hardware, software, and firmware. The methods provided are implemented in any of a variety of devices, such as a general-purpose computer, a processor, or a processor core. Suitable processors include, by way of example, a general-purpose processor, a special purpose processor, a conventional processor, a CPU, a GPU, a parallel accelerated processor, a plurality of microprocessors, one or more microprocessors in association with a DSP core, a controller, a microcontroller, ASICs, FPGAs circuits, any other type of IC, and/or a state machine.

In one or more implementations, the methods and procedures provided herein are implemented in a computer program, software, or firmware incorporated in a non-transitory computer-readable storage medium for execution by a general-purpose computer or a processor. Examples of non-transitory computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A processing device comprising:
a substrate including at least one processor core and one or more contacts configured to establish an electrical connection with the at least one processor core; and
an integrated heat spreader that is bonded to the substrate and covers the at least one processor core, the integrated heat spreader including:
a plurality of carveouts that expose at least one contact of the one or more contacts, the plurality of carveouts configured to receive a plurality of protrusions of a cooling device to mechanically align the cooling device with the processing device;
a first surface facing the at least one processor core; and
a second surface disposed opposite the first surface, the second surface contacting the cooling device to transfer heat away from the at least one processor core.

2. The processing device of claim 1, wherein the at least one processor core comprises one or more of a central processing unit, a graphics processing unit, or a parallel accelerated processor.

3. The processing device of claim 1, wherein the at least one processor core is configured to manage power consumption by the at least one processor core and regulate heat transfer for the processing device by communicating with a cooling device via the one or more contacts.

4. The processing device of claim 1, wherein the plurality of carveouts are configured to enable a press fit connection between the cooling device and the at least one contact of the one or more contacts exposed by the plurality of carveouts.

5. The processing device of claim 1, wherein the first surface contacts the at least one processor core.

6. The processing device of claim 5, wherein each of the plurality of carveouts include an additional surface oriented approximately perpendicular to the first surface and the second surface, the additional surface being configured to mechanically align the integrated heat spreader with a protrusion of the plurality of protrusions of the cooling device and transfer heat to the protrusion of the cooling device.

7. The processing device of claim 1, wherein the at least one processor core is configured to instruct, prior to execution of an operation, the cooling device to initiate cooling of the integrated heat spreader responsive to a determination that the execution of the operation will increase a temperature of the at least one processor core.

8. The processing device of claim 7, wherein the at least one processor core is configured to instruct the cooling device to initiate cooling of the integrated heat spreader by transmitting an instruction to a controller of the cooling device via the one or more contacts.

9. The processing device of claim 1, wherein the at least one processor core is configured to instruct the cooling device to initiate targeted cooling of a portion of a surface of the integrated heat spreader, wherein the portion of the surface of the integrated heat spreader is located at a same position relative to the substrate as the at least one processor core.

10. The processing device of claim 9, wherein the at least one processor core is configured to instruct the cooling device to initiate targeted cooling of the portion of the surface of the integrated heat spreader by concentrating air flow on the portion of the surface of the integrated heat spreader at an increased rate relative to air flow on at least one other portion of the surface of the integrated heat spreader.

11. The processing device of claim 1, wherein the substrate is silicon, the one or more contacts are surface mount empty pads, and the integrated heat spreader is plated copper.

12. The processing device of claim 1, wherein each of the plurality of carveouts are disposed along an edge of the integrated heat spreader and recede from an outer perimeter of the integrated heat spreader.

13. The processing device of claim 1, wherein the at least one contact of the substrate is configured to establish the electrical connection between the at least one processor core and the cooling device by contacting at least one additional contact disposed on at least one protrusion of the plurality of protrusions.

14. The processing device of claim 13, wherein the at least one processor core is configured to output a cooling device alignment error responsive to a disconnect being detected between the at least one contact and the at least one additional contact.

15. A system comprising:
a processing device including:
a substrate with at least one processor core and one or more contacts configured to establish an electrical connection with the at least one processor core;
an integrated heat spreader that is bonded to the substrate and covers the at least one processor core, the integrated heat spreader including:
a plurality of carveouts that expose the one or more contacts;
a first surface facing the at least one processor core; and
a second surface disposed opposite the first surface, the second surface contacting a cooling device to transfer heat away from the at least one processor core; and
the cooling device including a plurality of protrusions configured for insertion into the plurality of carveouts to mechanically align the cooling device with the processing device, at least one of the plurality of protrusions configured to establish an electrical connection with the at least one processor core using the one or more contacts.

16. The system of claim 15, wherein the at least one processor core is configured to manage power consumption by the at least one processor core and regulate heat transfer for the processing device by communicating with the cooling device via the electrical connection.

17. The system of claim 15, wherein the insertion of the plurality of protrusions into the plurality of carveouts establishes a press fit connection between the cooling device and the one or more contacts.

18. The system of claim 15, wherein the at least one processor core is configured to instruct the cooling device to initiate cooling of the integrated heat spreader responsive to a determination that execution of an operation will cause the at least one processor core to reach a temperature threshold.

19. The system of claim 18, wherein the at least one processor core is configured to instruct the cooling device to increase cooling of the integrated heat spreader responsive to a determination that the at least one processor core will reach an additional temperature threshold.

20. A processor socket comprising:
a processing device retained within the processor socket, the processing device including:
a substrate including at least one processor core and one or more contacts configured to establish an electrical connection with the at least one processor core; and
a lid that is attached to the substrate and covers the at least one processor core, the lid including:
a plurality of carveouts that expose at least one of the one or more contacts, the plurality of carveouts configured to receive a plurality of protrusions of a cooling device to mechanically align the cooling device with the processing device;
a first surface facing the at least one processor core; and
a second surface disposed opposite the first surface, the second surface contacting the cooling device to transfer heat away from the at least one processor core.

\* \* \* \* \*